(12) United States Patent
Chidambaram

(10) Patent No.: US 6,818,518 B1
(45) Date of Patent: Nov. 16, 2004

(54) METHOD FOR PRODUCING LOW/HIGH VOLTAGE THRESHOLD TRANSISTORS IN SEMICONDUCTOR PROCESSING

(75) Inventor: PR Chidambaram, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/602,994

(22) Filed: Jun. 24, 2003

(51) Int. Cl.[7] ............................................ H01L 21/336
(52) U.S. Cl. ...................... 438/289; 438/281; 438/286
(58) Field of Search ................................ 438/199, 200, 438/258, 281, 286, 289, 301

(56) References Cited

U.S. PATENT DOCUMENTS

| | | | | |
|---|---|---|---|---|
| 6,153,453 A | * | 11/2000 | Jimenez ...................... | 438/200 |
| 6,157,062 A | * | 12/2000 | Vasanth et al. ............. | 438/301 |
| 6,255,698 B1 | * | 7/2001 | Gardner et al. ............. | 257/369 |
| 6,277,690 B1 | * | 8/2001 | Hamilton et al. ........... | 438/258 |
| 6,362,049 B1 | * | 3/2002 | Cagnina et al. ............. | 438/258 |
| 6,388,288 B1 | * | 5/2002 | Vasanth et al. ............. | 438/275 |
| 6,465,307 B1 | * | 10/2002 | Chidambaram et al. .... | 438/286 |
| 6,482,703 B1 | * | 11/2002 | Yu .............................. | 438/281 |
| 6,579,781 B1 | * | 6/2003 | Hamilton et al. ........... | 438/514 |
| 6,713,334 B2 | * | 3/2004 | Nandakumar et al. ...... | 438/199 |

* cited by examiner

Primary Examiner—John F. Niebling
Assistant Examiner—Walter L. Lindsay, Jr.
(74) Attorney, Agent, or Firm—Jacqueline J. Garner; W. James Brady, III; Frederick J. Telecky, Jr.

(57) ABSTRACT

The present invention provides a system and method for processing low voltage threshold transistors on a semiconductor wafer. The method may include: forming core transistors with drains on the semiconductor wafer; forming low voltage threshold transistors with drains on the semiconductor wafer; forming input output transistors with drains on the semiconductor wafer; forming a spacing layer over the core, low voltage and input output transistors; forming a first photoresist mask layer over the low voltage transistors; doping the drains of the core and the input output transistors, wherein the doping is a medium doping; forming a second photoresist mask layer over the input output transistors; and doping the drains of the core and the low voltage threshold transistors, wherein the doping is a medium doping.

27 Claims, 4 Drawing Sheets

US 6,818,518 B1

METHOD FOR PRODUCING LOW/HIGH VOLTAGE THRESHOLD TRANSISTORS IN SEMICONDUCTOR PROCESSING

BACKGROUND OF THE INVENTION

The present invention relates generally to semiconductor processing and, more particularly, to a method for improving the process of forming low and high voltage threshold transistors on semiconductor wafers.

In the semiconductor device manufacturing industry, efforts are continuing for the purpose of further downsizing a single package semiconductor device. The initial efforts in the miniaturzation of a semiconductor device were directed to reduce the size of the semiconductor chip itself. By making the semiconductor chip smaller, the number of chips that could be obtained from one wafer was increased. In addition to bringing down manufacturing costs, the operating speed was increased since the movement distance of electrons between each element could be made shorter. Further, the development of microscopic processing technology decreased the chip size and allowed for the manufacture of a semiconductor device having the same functions. The current leading-edge design guideline for a device is less than 0.18 mu., and thus, it has become possible to place more than two million units on a single semiconductor chip.

As the size of the semiconductor device decreases, electric current from leakage gets more important. Leakage current limits the performance of the semiconductor device. Libraries with high voltage threshold (vt) transistors run at slower speeds but leak less power when they are inactive. Low vt cells, however, run faster but create more leakage current. Semiconductor device designers are constantly trying to find the right mix of low and high vt transistors in the device to optimize its performance. In addition, any reduction in processing steps usually means that the cost of making each device is cheaper and is highly desirable.

Therefore, what is needed, is a system and method that provides any savings of the cost in producing semiconductor devices. Further, optimization of the design of semiconductor devices is also needed.

SUMMARY OF THE INVENTION

The present invention provides a reduction in mask layers in producing low and high vt transistors. Moreover, the present invention also provides a method of optimizing the speed of the transistors.

The present invention provides a system and method for processing low voltage threshold transistors on a semiconductor wafer. The method may include: forming core transistors with drains on the semiconductor wafer; forming low voltage threshold transistors with drains on the semiconductor wafer; forming input output transistors with drains on the semiconductor wafer; forming a spacing layer over the core, low voltage and input output transistors; forming a first photoresist mask layer over the low voltage transistors; doping the drains of the core and the input output transistors, wherein the doping is a medium doping; forming a second photoresist mask layer over the input output transistors; and doping the drains of the core and the low voltage threshold transistors, wherein the doping is a medium doping.

A second method of the invention may include: forming core transistors with drains on the semiconductor wafer; forming low voltage threshold transistors with drains on the semiconductor wafer; forming input output transistors with drains on the semiconductor wafer; forming a first photoresist mask layer over the low voltage and the input output transistors; doping the drains of the core transistors, wherein the doping is a medium doping; forming a spacing layer over the core, low voltage and input output transistors; forming a second photoresist mask layer over the input output transistors; doping the drains of the core and the low voltage threshold transistors, wherein the doping is a medium doping; forming a third photoresist mask layer over the core and the low voltage transistors; and doping the drains of the input output transistors, wherein the doping is a medium doping.

Therefore, in accordance with the previous summary, objects, features and advantages of the present disclosure will become apparent to one skilled in the art from the subsequent description and the appended claims taken in conjunction with the accompanying drawings.

DETAILED DESCRIPTION OF THE PREFERRED EMBODIMENTS

The present disclosure is described by the embodiments given below. It is understood, however, that the embodiments below are not necessarily limitations to the present disclosure, but are used to describe a typical implementation of the invention.

Figure 1:
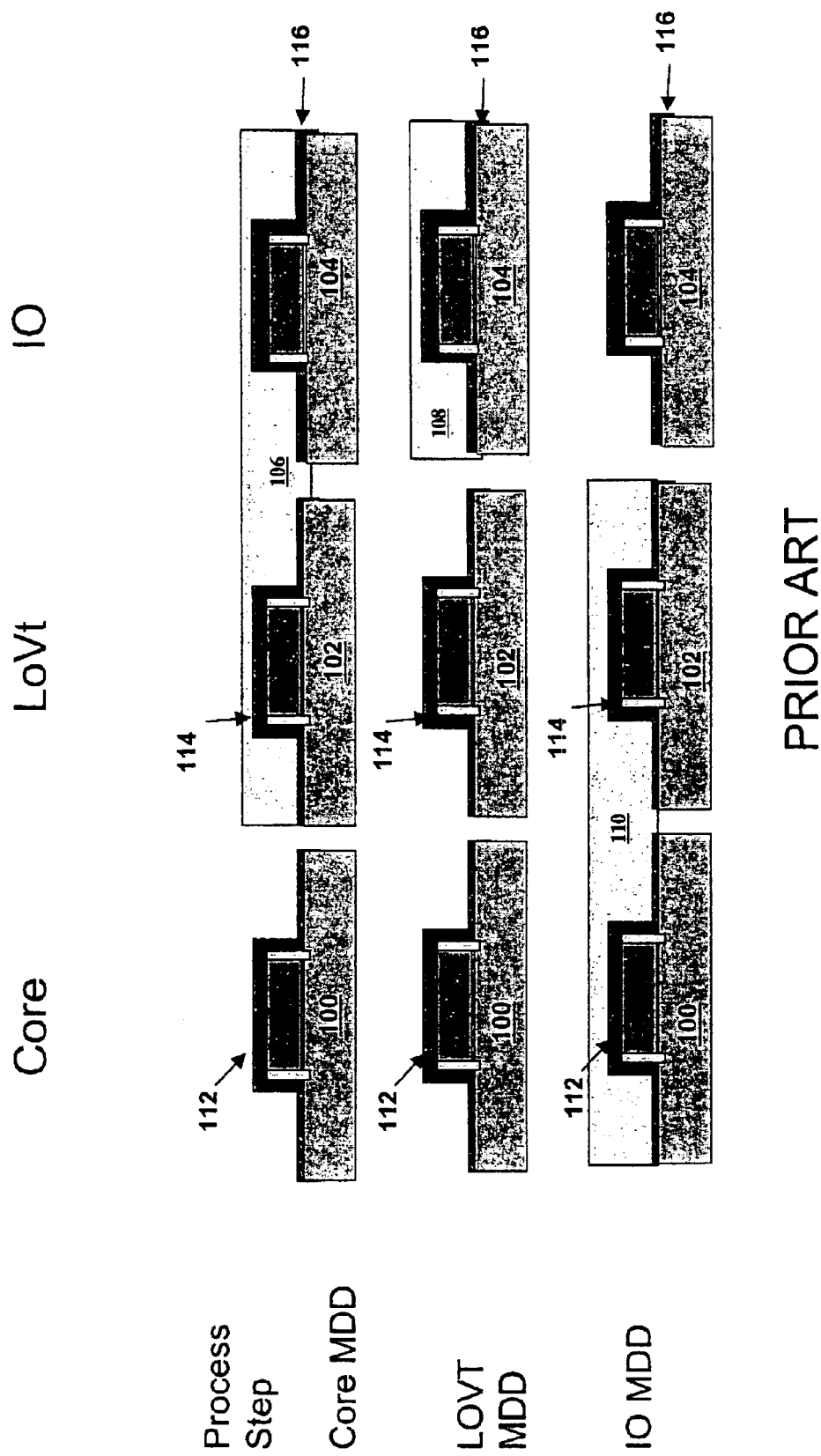
FIG. 1 is a diagram of the baseline process for low voltage threshold devices.

The conventional method of making a low voltage threshold (vt) transistor within a device is illustrated by FIG. 1. A core transistor 100, a low vt transistor 102, and an input/output transistor 104 are shown at three different process steps. Each transistor is shown with a gate and drains on both sides of the gate. The first process step shown is the core medium doped drain (MDD) step to dope the exposed drains. Before this step, a spacer layer 112, 114, and 116 was formed on top of each transistor 100, 102 and 104. At this step, a first mask layer 106 is formed on top of the low vt 102 and the input/output transistor 104. The first mask allows dopant to reach only the drains of the core transistor 100 and prohibits any from reaching the drains of the low vt 102 and the input/output transistor 104.

The next step shown is the low vt MDD. In this step, a second mask layer 108 is formed on top of the input/output transistor 104. This second mask layer 108 allows dopant to reach the drains of the core 100 and the low vt 102 transistors, and prohibits the dopant from reaching the drains of the input/output transistor 104.

The next step shown is the input/output MDD. In this step, a third mask layer 110 is formed on top of the core 100 and the low vt 102 transistors. This third mask layer 110 allows dopant to reach the drains of the only the input/output 104 transistors, and prohibits the dopant from reaching the drains of the core 100 and the low vt 102 transistors.

Figure 2:
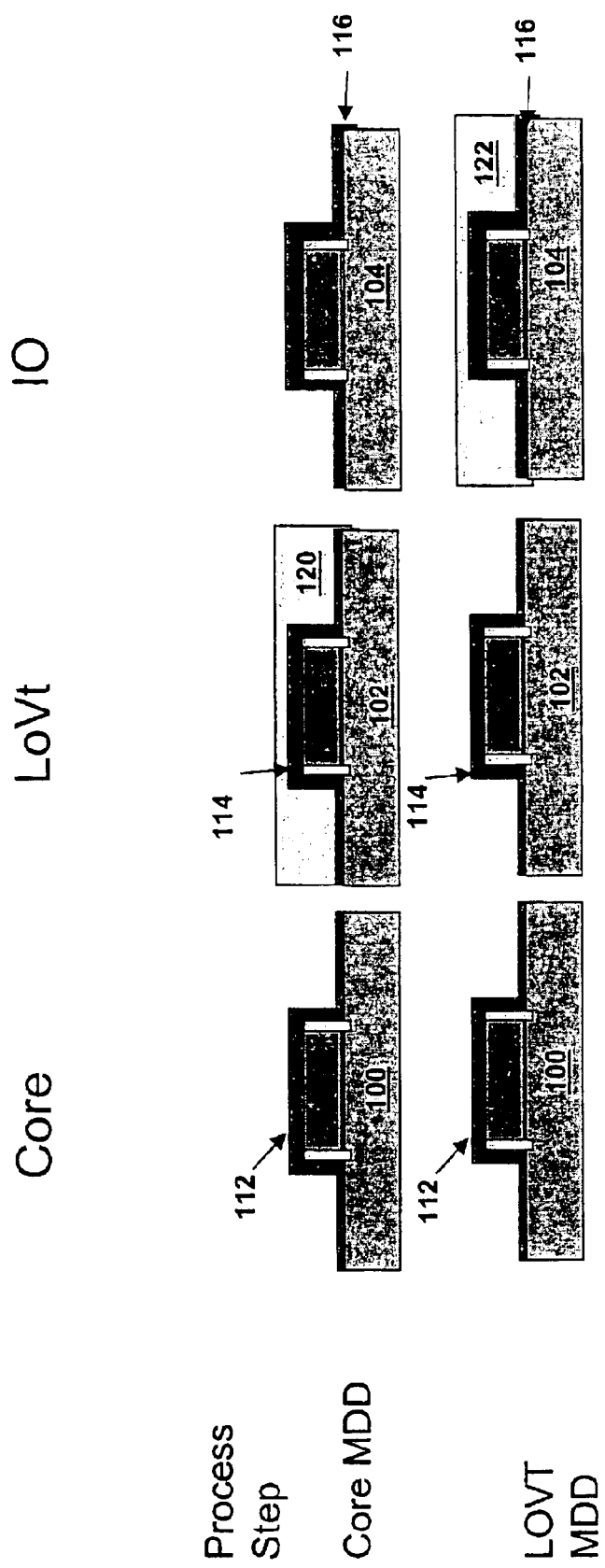
FIG. 2 is a diagram of a streamlined method of processing low voltage threshold devices.

A first embodiment of the present invention is illustrated in FIG. 2. In this embodiment, by redesigning the masking layers, a process step can be eliminated thereby producing a significant cost savings for each device. The first process step shown is a modified core medium doped drain (MDD) step. Before this step, a spacer layer 112, 114, and 116 was formed on top of each transistor 100, 102 and 104. At this step, a first mask layer 120 is formed on top of the low vt 102. The first mask allows dopant to reach the drains of the core 100 and the input/output 104 transistors and prohibits any from reaching the drains of the low vt 102.

The next step shown is the low vt MDD. In this step, a second mask layer 108 is formed on top of the input/output transistor 104. This second mask layer 108 allows dopant to reach the drains of the core 100 and the low vt 102 transistors, and prohibits the dopant from reaching the drains of the input/output transistor 104.

This design of the masking layers and process steps provides the same amount of dopant in each drain as the conventional design, but eliminates a step and thus provides a significant cost savings for each device.

Figure 3:
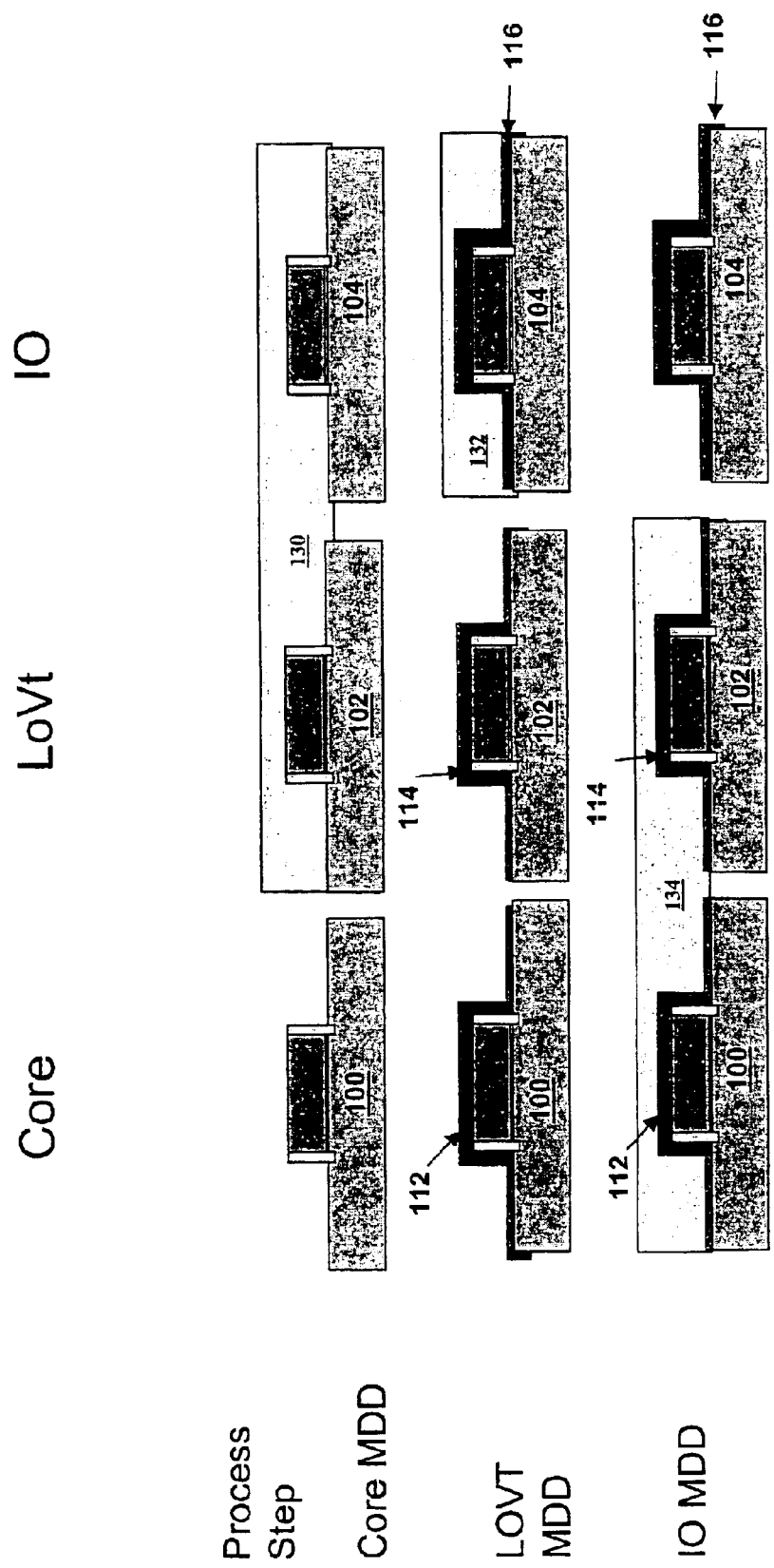
FIG. 3 is a diagram of a method of processing low voltage threshold devices for optimum performance.

A second embodiment is illustrated in FIG. 3. Again, a core transistor 100, a low vt transistor 102, and an input/output transistor 104 are shown at three different process steps. The first process step shown is the core MDD step. However, unlike the convention design, the spacer layer is not formed before the core MDD step. At this step, a first mask layer 106 is formed on top of the low vt 102 and the input/output transistor 104. The first mask allows dopant to reach only the drains of the core transistor 100 and prohibits any from reaching the drains of the low vt 102 and the input/output transistor 104. After the doping, the spacer layer 112, 114, and 116 is formed on top of each transistor 100, 102 and 104.

The next step shown is the low vt MDD. In this step, a second mask layer 108 is formed on top of the input/output transistor 104. This second mask layer 108 allows dopant to reach the drains of the core 100 and the low vt 102 transistors, and prohibits the dopant from reaching the drains of the input/output transistor 104.

The next step shown is the input/output MDD. In this step, a third mask layer 110 is formed on top of the core 100 and the low vt 102 transistors. This third mask layer 110 allows dopant to reach the drains of the only the input/output 104 transistors, and prohibits the dopant from reaching the drains of the core 100 and the low vt 102 transistors. The new design of the second embodiment results in an optimization of performance of the transistors.

Figure 4:
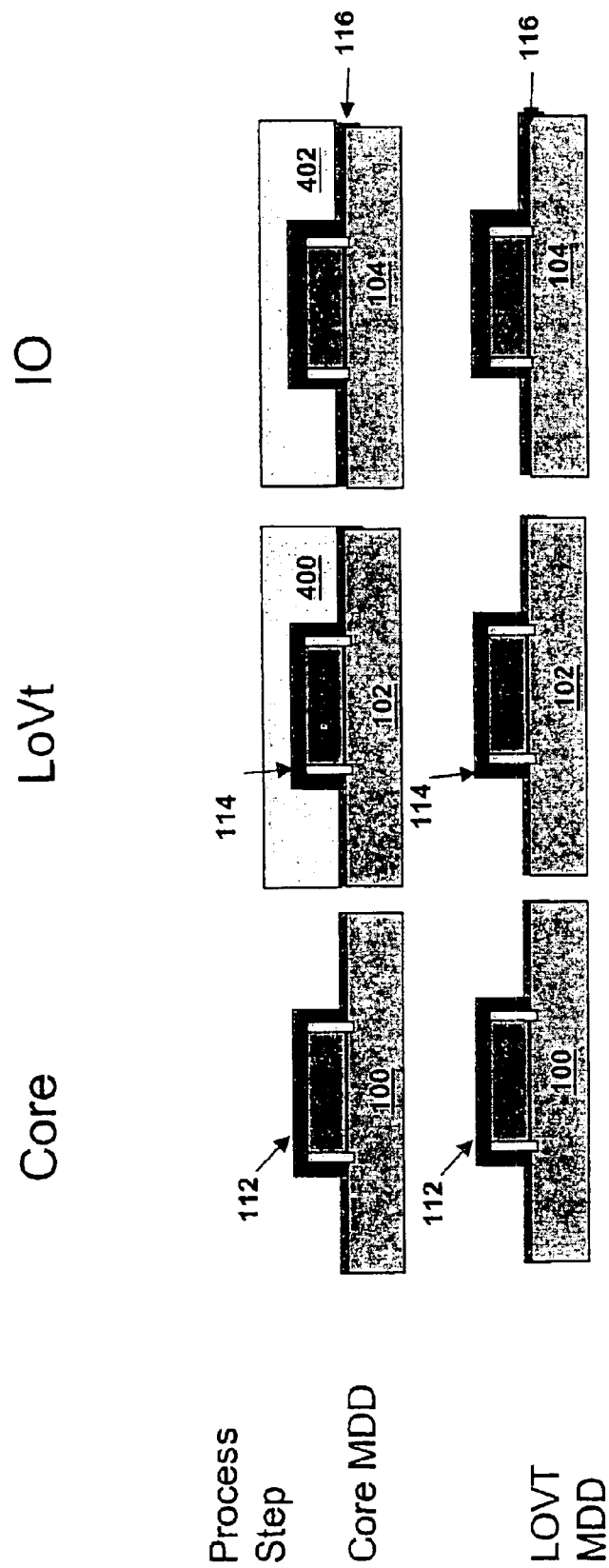
FIG. 4 is a diagram of a streamlined method of processing low voltage threshold devices.

A third embodiment of the present invention is illustrated in FIG. 4. In this embodiment, by another redesign of the masking layers, a process step can be eliminated thereby producing a significant cost savings for each device. The first process step shown is a modified core MDD step. Before this step, a spacer layer 112, 114, and 116 was formed on top of each transistor 100, 102 and 104. At this step, a first mask layer 400 and 402 is formed on top of the low vt 102 and the IO transistor 104, respectively. The first mask allows dopant to reach the drains of the core 100 transistor and prohibits any from reaching the drains of the low vt 102 and the IO transistor 104.

The next step shown is the low vt MDD. In this step, a mask layer is not formed on top of any of the transistors. The lack of mask layer allows dopant to reach the drains of the core 100, the low vt 102 and the IO 104 transistors.

This design of the masking layers and process steps also provides the same amount of dopant in each drain as the conventional design, but eliminates a step and thus provides a significant cost savings for each device.

It is understood that several modifications, changes and substitutions are intended in the foregoing disclosure and in some instances some features of the invention will be employed without a corresponding use of other features. Specifically, although the embodiments illustrate only one transistor for the core, low vt and the input/output sections, it is understood that each transistor is only illustrative and can actually represent many transistors. In addition, these embodiments, the core section represents most of the electrical devices towards the center of the semiconductor wafer. Accordingly, it is appropriate that the appended claims be construed broadly and in a manner consistent with the scope of the invention.

What is claimed is:

1. A method for processing low voltage threshold transistors on a semiconductor wafer, the method comprising:

forming core transistors with drains on the semiconductor wafer;

forming low voltage threshold transistors with drains on the semiconductor wafer;

forming input/output transistors with drains on the semiconductor wafer;

forming a spacing layer over the core, low voltage and input/output transistors;

forming a first photoresist mask layer over the low voltage transistors;

doping the drains of the core and the input/output transistors, wherein the doping is a medium doping;

forming a second photoresist mask layer over the input/output transistors; and doping the drains of the core and the low voltage threshold transistors, wherein the doping is a medium doping.

2. The method of claim 1 wherein the doping includes doping Arsenic.

3. The method of claim 2 wherein the doping includes doping at a range from 1–40 kev at 2e14 to 3 e15.

4. The method of claim 1 wherein the doping includes doping Phosphorus.

5. The method of claim 4 wherein the doping includes doping at a range from 1–30 keV 2 e14 to 3 e15.

6. The method of claim 1 wherein the doping includes doping Boron.

7. The method of claim 6 wherein the doping includes doping at a range from 0.5 ev 2 e14 to 3 e15.

8. The method of claim 1 wherein the doping includes doping Boron di-fluoride.

9. The method of claim 8 wherein the doping includes doping at a range from 2 keV to 20 keV 2 e14 to 3 e15.

10. A method for processing low voltage threshold transistors on a semiconductor wafer, the method comprising:

forming core transistors with drains on the semiconductor wafer;

forming low voltage threshold transistors with drains on the semiconductor wafer;

forming input/output transistors with drains on the semiconductor wafer;

forming a first photoresist mask layer over the low voltage and the input/output transistors;

doping the drains of the core transistors, wherein the doping is a medium doping;

forming a spacing layer over the core, low voltage and input/output transistors;

forming a second photoresist mask layer over the input/output transistors;

doping the drains of the core and the low voltage threshold transistors, wherein the doping is a medium doping;

forming a third photoresist mask layer over the core and the low voltage transistors; and doping the drains of the input/output transistors, wherein the doping is a medium doping.

11. The method of claim 10 wherein the doping includes doping Arsenic.

12. The method of claim 11 wherein the doping includes doping at a range from 1–40 kev at 2e14 to 3 e15.

13. The method of claim 10 wherein the doping includes doping Phosphorus.

14. The method of claim 13 wherein the doping includes doping at a range from 1–30 keV 2 e14 to 3 e15.

15. The method of claim 10 wherein the doping includes doping Boron.

16. The method of claim 15 wherein the doping includes doping at a range from 0.5 ev 2 e14 to 3 e15.

17. The method of claim 10 wherein the doping includes doping Boron di-fluoride.

18. The method of claim 17 wherein the doping includes doping at a range from 2 keV to 20 keV 2 e14 to 3 e15.

19. A method for processing low voltage threshold transistors on a semiconductor wafer, the method comprising:

forming core transistors with drains on the semiconductor wafer;

forming low voltage threshold transistors with drains on the semiconductor wafer;

forming input/output transistors with drains on the semiconductor wafer;

forming a spacing layer over the core, low voltage and input/output transistors;

forming a photoresist mask layer over the low voltage transistors and the IO transistors;

doping the drains of the core transistors, wherein the doping is a medium doping;

removing the photoresist mask layer; and doping the drains of the core, the low voltage threshold, and the IO transistors, wherein the doping is a medium doping.

20. The method of claim 19 wherein the doping includes doping Arsenic.

21. The method of claim 20 wherein the doping includes doping at a range from 1–40 kev at 2e14 to 3 e15.

22. The method of claim 19 wherein the doping includes doping Phosphorus.

23. The method of claim 22 wherein the doping includes doping at a range from 1–30 keV 2 e14 to 3 e15.

24. The method of claim 19 wherein the doping includes doping Boron.

25. The method of claim 24 wherein the doping includes doping at a range from 0.5 ev 2 e14 to 3 e15.

26. The method of claim 19 wherein the doping includes doping Boron di-fluoride.

27. The method of claim 26 wherein the doping includes doping at a range from 2 keV to 20 keV 2 e14 to 3 e15.

* * * * *